(12) United States Patent
Cooke

(10) Patent No.: US 7,772,904 B1
(45) Date of Patent: Aug. 10, 2010

(54) VOLTAGE LEVEL CONVERTER WITH MIXED SIGNAL CONTROLLER

(75) Inventor: Philip Cooke, Raleigh, NC (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/371,799

(22) Filed: Feb. 16, 2009

(51) Int. Cl.
*H03K 3/017* (2006.01)
(52) U.S. Cl. ...................................... 327/175
(58) Field of Classification Search ................. 323/283; 363/21.05, 21.13, 95–98; 327/175
See application file for complete search history.

(56) References Cited

U.S. PATENT DOCUMENTS

| | | | |
|---|---|---|---|
| 6,055,168 A | 4/2000 | Kotowski et al. | |
| 6,366,070 B1 * | 4/2002 | Cooke et al. | 323/284 |
| 6,815,936 B2 | 11/2004 | Wiktor et al. | |
| 7,075,280 B2 | 7/2006 | May | |
| 7,139,180 B1 | 11/2006 | Herbert | |
| 7,345,464 B2 * | 3/2008 | Steele | 323/288 |
| 7,428,159 B2 | 9/2008 | Leung et al. | |
| 7,459,864 B2 | 12/2008 | Lys | |
| 2008/0042632 A1 * | 2/2008 | Chapuis et al. | 323/283 |
| 2008/0252280 A1 | 10/2008 | Prodic et al. | |

* cited by examiner

*Primary Examiner*—Adolf Berhane
*Assistant Examiner*—Emily Pham
(74) *Attorney, Agent, or Firm*—Coats & Bennett, P.L.L.C.

(57) ABSTRACT

According to an embodiment, a mixed signal controller includes a fine controller, a coarse controller and a digital controller. The fine controller is operable to output an analog modulation signal responsive to an analog control signal and a voltage signal input to the fine controller. The coarse controller is operable to output a digital pulse width modulation (PWM) signal responsive to the analog modulation signal and an analog PWM reference signal input to the coarse controller. The digital controller is operable to program the analog control signal and the analog PWM reference signal responsive to the digital PWM signal so that the fine and coarse controllers together regulate the voltage signal at a predetermined voltage level.

29 Claims, 11 Drawing Sheets

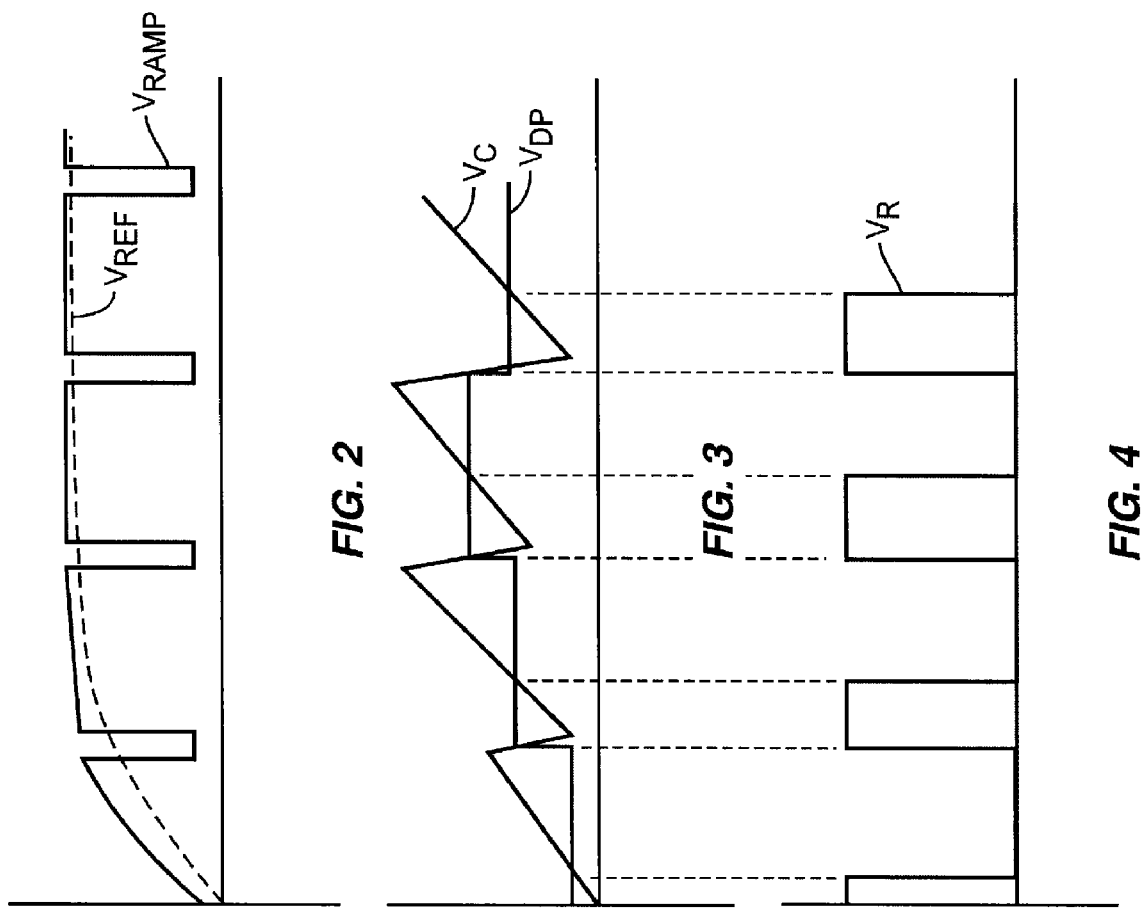

US 7,772,904 B1

VOLTAGE LEVEL CONVERTER WITH MIXED SIGNAL CONTROLLER

BACKGROUND

A controller is typically used to control the operation of voltage level converters such as synchronous buck or buck-boost converters. Some types of conventional controllers include a digital pulse width modulator (DPWM) for generating control signals used to operate the voltage level converter circuit, e.g., by driving the gates of transistors devices included in the voltage converter. The DPWM is a part of a closed-loop error control function for regulating the voltage output by the voltage level converter circuit. However, the feedback signals processed by the controller must be converted from the analog to digital domain prior to processing by the PID control and the DPWM. The analog-to-digital conversion process increases bias supply power consumption and induces delay. The overall phase margin of the controller is reduced when delay is added to the signal processing path. To compensate for reduced phase margin, the controller typically over-samples at higher switching frequencies. However, over-sampling increases complexity and power requirements.

In addition, a DPWM inherently has relatively low resolution compared to an analog equivalent PWM circuit. As such, the digital signals processed and output by the DPWM have restrictions on their precision, reducing the ease of designing with the DPWM as a control element in a voltage level converter circuit. The DPWM can also introduce limit cycle oscillations during operation of the voltage level converter if the digital controller is not designed properly. DPWMs also tend to be larger than their analog counterpart PWMs, consuming more silicon area and thus increasing overall system cost. Other types of digital voltage level converter control circuits tend to be implemented by converting the functionality of an equivalent analog circuit to the digital domain block-by-block. Converting an analog design to the digital domain block-by-block is inflexible and lengthens the circuit design process and may create incompatibility issues for next-generation designs.

SUMMARY

According to an embodiment, a mixed signal controller includes a fine controller, a coarse controller and a digital controller. The fine controller is operable to output an analog modulation signal responsive to an analog control signal and a voltage signal input to the fine controller. The coarse controller is operable to output a digital pulse width modulation (PWM) signal responsive to the analog modulation signal and an analog PWM reference signal input to the coarse controller. The digital controller is operable to program the analog control signal and the analog PWM reference signal responsive to the digital PWM signal so that the fine and coarse controllers together regulate the voltage signal at a predetermined voltage level.

Those skilled in the art will recognize additional features and advantages upon reading the following detailed description, and upon viewing the accompanying drawings.

BRIEF DESCRIPTION OF THE DRAWINGS

FIGS. 2-4 illustrate waveform diagrams associated with the operation of the mixed-signal controller of FIG. 1.

DETAILED DESCRIPTION

Figure 1:
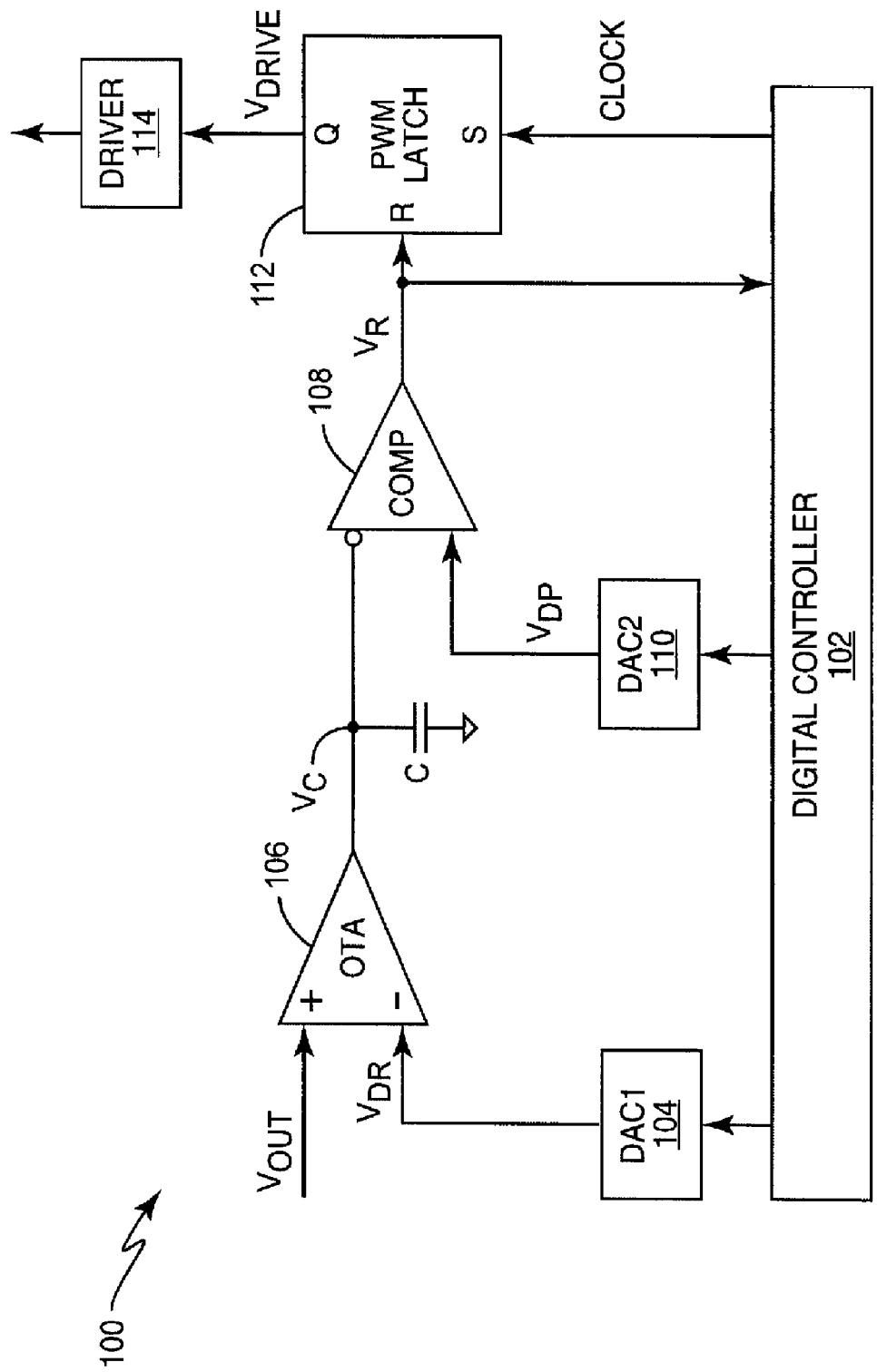
FIG. 1 illustrates a circuit diagram of an embodiment of a mixed-signal controller.

FIG. 1 illustrates an embodiment of a mixed-signal controller 100 for use in voltage level conversion applications. The mixed-signal controller 100 combines analog and digital circuitry to implement voltage regulation functionality. The analog controller portion of the mixed-signal controller 100 has infinite resolution and provides fine control so that very precise adjustments can be made over time. The digital controller portion of the mixed-signal controller 100 has less resolution than the analog portion and thus provides coarse control with high performance digital methods. The digital portion of the controller 100 has very fast transient response in a large-signal or non-linear operating mode, enabling fast correction of a regulated output voltage due to disturbances such as a load transient or input voltage transient.

According to an embodiment, the mixed-signal controller 100 includes a digital controller 102 which drives a first digital-to-analog converter (DAC1) 104. The output ($V_{DR}$) of DAC1 104 has a DC component ($V_{REF}$) and an AC component ($V_{RAMP}$) according to this embodiment as shown in FIG. 2. The DC component is the target or reference voltage to which the output voltage ($V_{OUT}$) is regulated by the mixed-signal controller 100. The AC component induces an asymmetrical ramp-up/ramp-down AC voltage at the node labeled $V_C$ which is the output of an operational transconductance amplifier (OTA) 106. The regulated output voltage and the output of DAC1 104 are input to the OTA 106. In response, the OTA 106 outputs an analog modulation signal at $V_C$ which is the superposition of two analog signal components. In one embodiment, $V_C$ has a sawtooth waveform as shown in FIG. 3. The first component of $V_C$ is $V_{REF}$ and is a function of $V_{OUT}$ and drives node $V_C$ to the proper analog voltage level. This in turn produces the correct modulation for a voltage level converter (not shown in FIG. 1) coupled to the mixed-signal controller 100 as will be described in more detail later herein. This way, the output of the converter can be reliably and precisely regulated to a desired level by the mixed-signal controller 100.

The second component of the of the analog modulation signal at node $V_C$ is a ramp component also produced by the OTA 106 when the output of the OTA 106 is coupled to a capacitor (C) as shown in the embodiment of FIG. 1. The capacitor and the OTA 106 are one embodiment of a fine controller and together form an integrator. Other circuit compensation schemes at the output and inputs of the OTA 106 or even a voltage mode error amplifier can also be used to generate $V_C$. The second analog component of $V_C$ is a function of the AC component of the DAC1 output ($V_{DR}$). $V_C$ is applied to the inverting input of a PWM comparator 108 which is one embodiment of a coarse controller. The non-inverting input of the PWM comparator 108 is derived from a second DAC (DAC2) 110. DAC2 110 outputs an analog PWM reference signal ($V_{DP}$) as shown in FIG. 3 which is programmed by the digital controller 102. The two inputs driving the PWM comparator 110 generate a digital PWM signal ($V_R$), e.g., as shown in FIG. 4. The pulse width of $V_R$ modulates as a function of the difference in voltage levels between the analog inputs ($V_C$ and $V_{DP}$) to the PWM comparator 108 and can be used to control the voltage level converter coupled to the mixed-signal controller 100.

In one embodiment, the digital PWM signal ($V_R$) output by the PWM comparator 108 is applied to the reset input of a reset-set latch 112. $V_R$ resets the reset-set latch 112 and a clock signal generated by the digital controller 102 sets the latch 112. In one embodiment, the output ($V_{DRIVE}$) of the reset-set latch 112 controls a gate driver circuit 114. According to this embodiment, the reset-set latch 112 communicates on/off states to transistor components of the voltage level converter coupled to the gate driver circuit 114 for modulating the transistors and thus regulating the output voltage.

The digital PWM signal ($V_R$) output by the PWM comparator 108 is also communicated back to the digital controller 102 for analysis. The digital controller 102 directly processes $V_R$ without having to perform analog-to-digital conversion. Digital circuits and state machines included in the digital controller 102 track the current operating state of the mixed-signal controller 100 and program the two DAC voltages ($V_{DR}$ and $V_{DP}$) responsive to the state of $V_R$ so that the output voltage ($V_{OUT}$) is properly regulated over time for various load and line conditions. Logic associated with the digital controller 102 can track $V_{OUT}$ via $V_C$ within the resolution of DAC1 104. This way, the DC component ($V_{REF}$) of the DAC1 output can be adjusted to prevent windup or saturation at the control-loop control voltage node $V_C$ as will be described in more detail later herein. Adjusting $V_{REF}$ in this way provides a reduced complexity closed-loop startup and transient operation scheme.

The digital controller 102 is also aware of the history and sequence of commands issued to DAC1 104 and DAC2 110 which are converted to analog voltages. The converted analog voltages are then used by the OTA 106 and the PWM comparator 108 to regulate the output voltage through a combined analog (fine-control) and digital (coarse-control) control arrangement as previously described herein. The analog voltage ($V_{DP}$) output by DAC2 110 can also be adjusted over time by the digital controller 102 to assist in the control function implemented by the OTA 106 and capacitor. Since $V_{DP}$ is a quasi-static DC value, the square-wave component of the DAC1 output ($V_{DR}$) in-turn creates the sawtooth waveform present at node $V_C$, effectively achieving PWM modulation. Thus, both analog and digital circuits are combined in a minimal way while avoiding typical DPWM resolution issues of conventional mixed-signal controllers and maximizing benefits of digital control while reducing complexity of the overall architecture. The mixed-signal controller 100 disclosed herein is very flexible and can be a building block for many voltage converter applications with fast deployment of designs through fast HDL (hardware description languages, e.g., Verilog, VHDL, System C) or other available programming languages.

Figure 5:
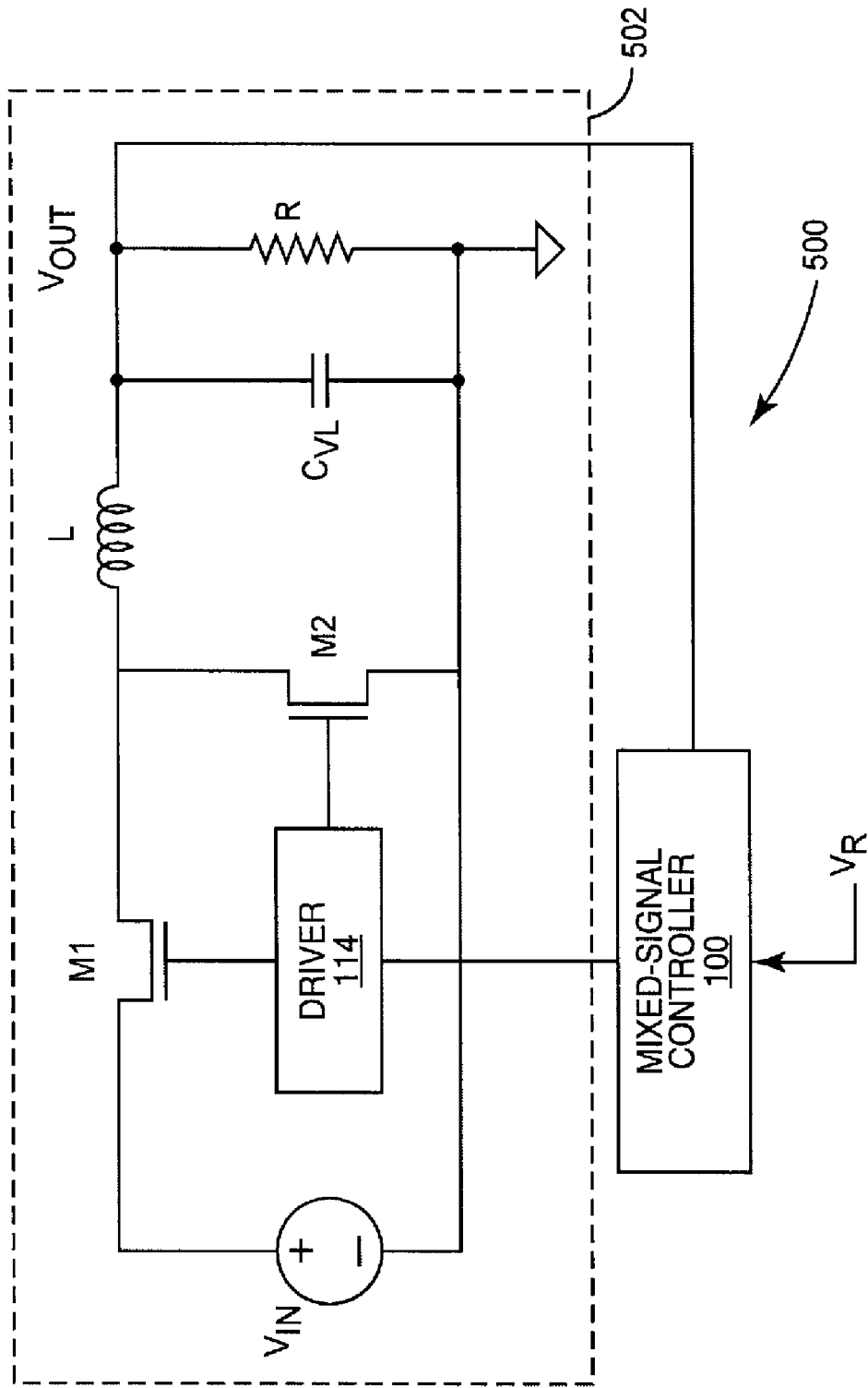
FIG. 5 illustrates a circuit diagram of an embodiment of a voltage converter circuit including a voltage level converter and a mixed-signal controller.

FIG. 5 illustrates an embodiment of a voltage converter circuit 500 including a voltage level converter 502 and the mixed-signal controller 100. According to this embodiment, the voltage level converter 502 is a synchronous-buck converter including MOSFETs M1 and M2, an inductor (L), a capacitor ($C_{VL}$) and a resistor (R) representing a load impedance. Other power circuit topologies are possible, such as boost topologies, buck-boost topologies, both non-isolated and isolated derivatives of these converter topologies, etc. For example, a current-fed push-push converter is one such topology that can be regulated with the addition of an analog inner current loop used to avoid flux-imbalance of the transformer. In any case, the output voltage ($V_{OUT}$) across the resistor is a function of the input voltage ($V_{IN}$) and is regulated by the mixed-signal controller 100 to closely track $V_{DR}$. During operation, the controller 100 prevents both transistors of the voltage level converter 502 from being switched on at the same time. This ensures proper operation of the voltage level converter.

Figure 6:
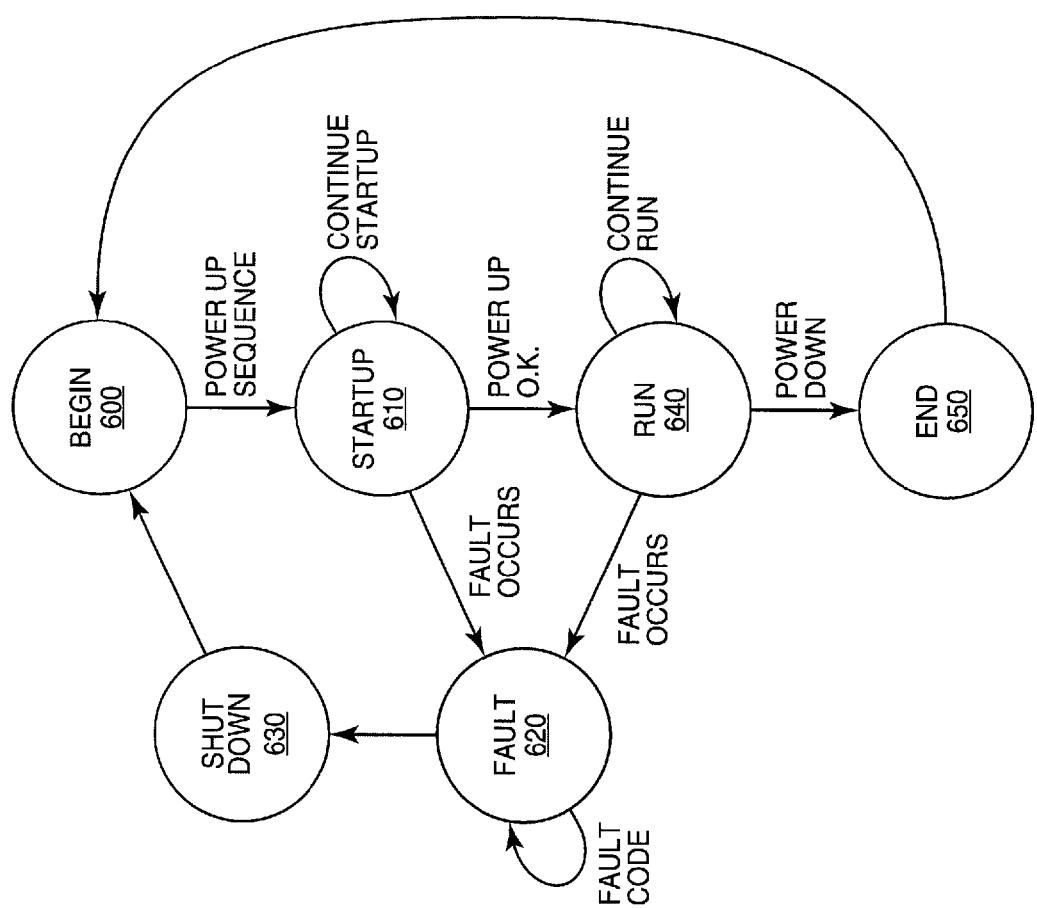
FIG. 6 illustrates a state diagram of an embodiment of program logic implemented by the mixed-signal controller of FIG. 5.

FIG. 6 illustrates an embodiment of program logic implemented by the mixed-signal controller 100 during operation. The controller 100 is in an initial state (600) and transitions to a startup state (610) during power up. If a fault occurs during startup, the controller 100 switches to a fault handling state (620). The controller 100 enters a shut down state (630) after executing the appropriate fault code. If no fault occurs during start up, the controller 100 enters a normal operating state (640) where the output voltage of the voltage level converter 502 is regulated at a predetermined level. The mixed-signal controller 100 can also be placed in a power down state (650) during operation.

Figure 7:
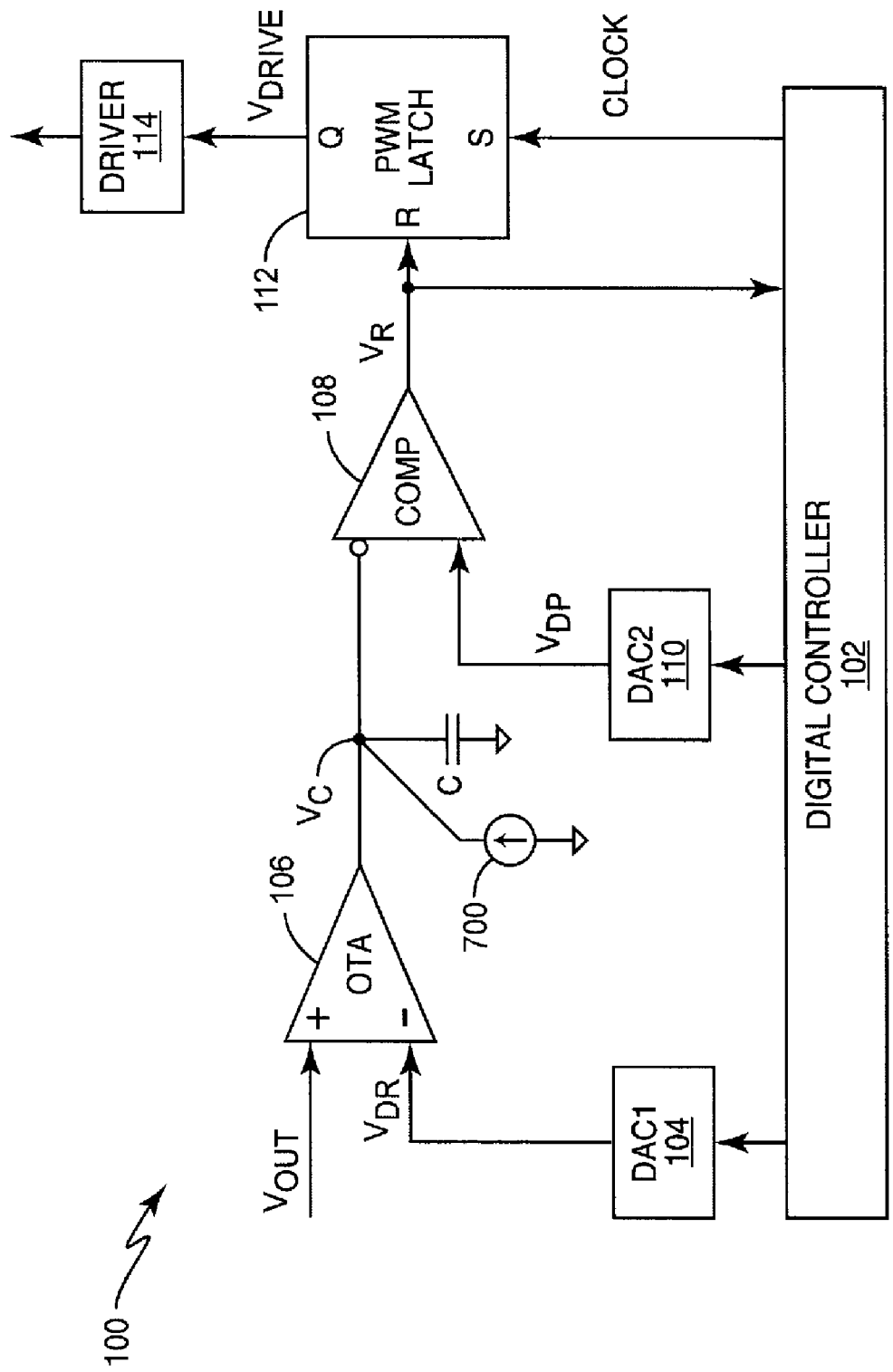
FIG. 7 illustrates a circuit diagram of another embodiment of a mixed-signal controller.

FIG. 7 illustrates another embodiment of the mixed-signal controller 100 where a current source 700 is used to induce the sawtooth modulation waveform at the output of the OTA 106, e.g., as illustrated by signal $V_C$ in FIG. 3. The current source 700 is coupled to the output of the OTA 106 at node $V_C$, which along with the capacitor (C) form another embodiment of a fine controller. According to this embodiment, DAC1 104 outputs just the DC reference voltage ($V_{REF}$) so that the output voltage ($V_{OUT}$) can be regulated to closely track $V_{DR}$. The modulation component of the OTA output is induced by the current source 700 instead of DAC1 104.

Figure 8:
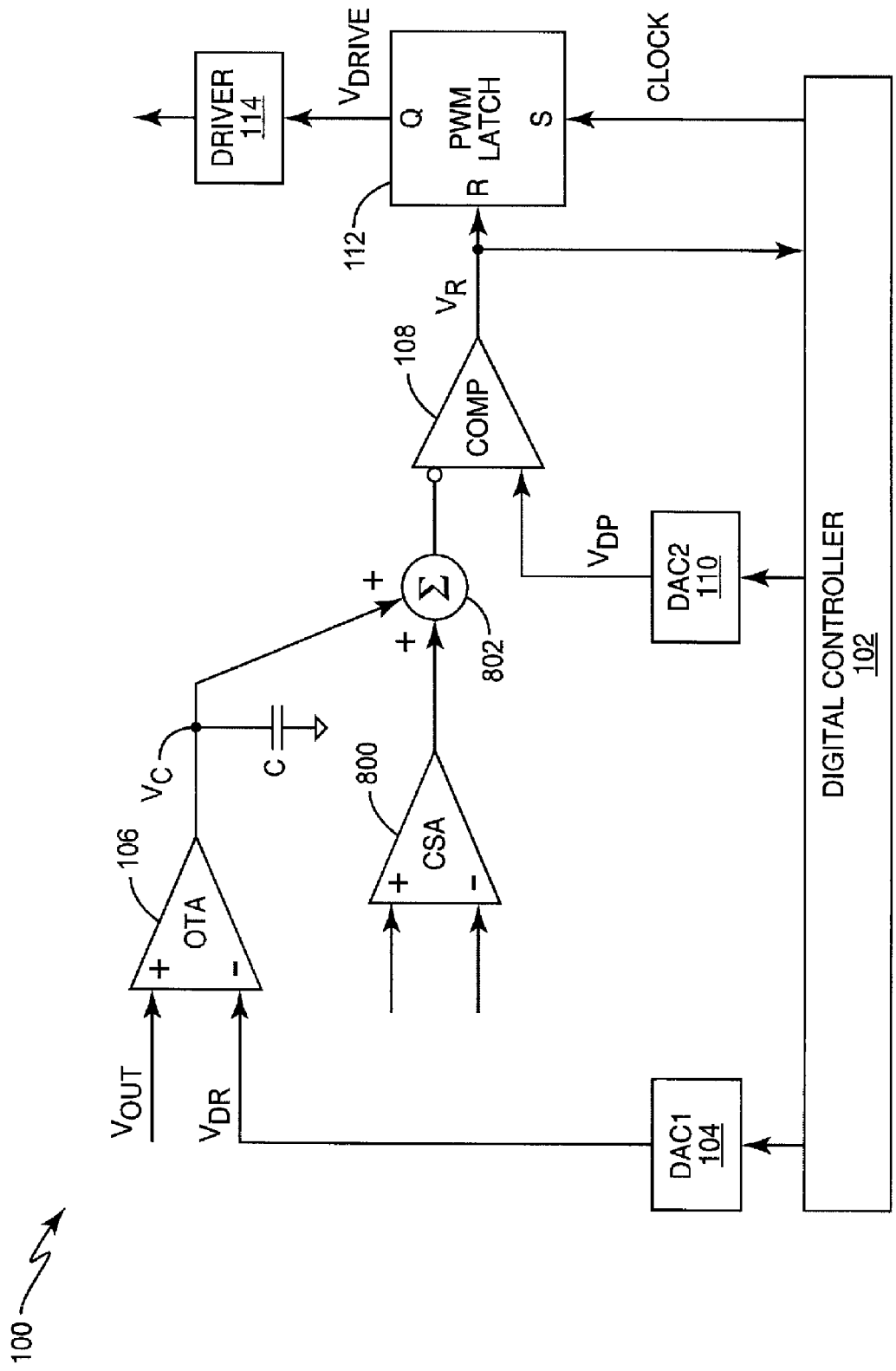
FIG. 8 illustrates a circuit diagram of yet another embodiment of a mixed-signal controller.

FIG. 8 illustrates yet another embodiment of the mixed-signal controller 100 where the modulation component of $V_C$ is induced by a current sense amplifier 800 coupled to the output of the OTA 106, which along with the capacitor (C) form yet another embodiment of a fine controller. According to this embodiment, the current sense amplifier 800 induces the sawtooth modulation waveform summed with the output of the OTA 106. Accordingly, DAC1 104 outputs just the DC reference voltage ($V_{REF}$) so that the output voltage ($V_{OUT}$) can be regulated to closely track $V_{DR}$. A summer circuit 802 combines the signal outputs of the current sense amplifier 800 and the OTA 106 to drive the inverting input of the PWM comparator 108. In one embodiment, the current sense amplifier 800 may derive this signal by sensing the inductor current.

Figure 9:
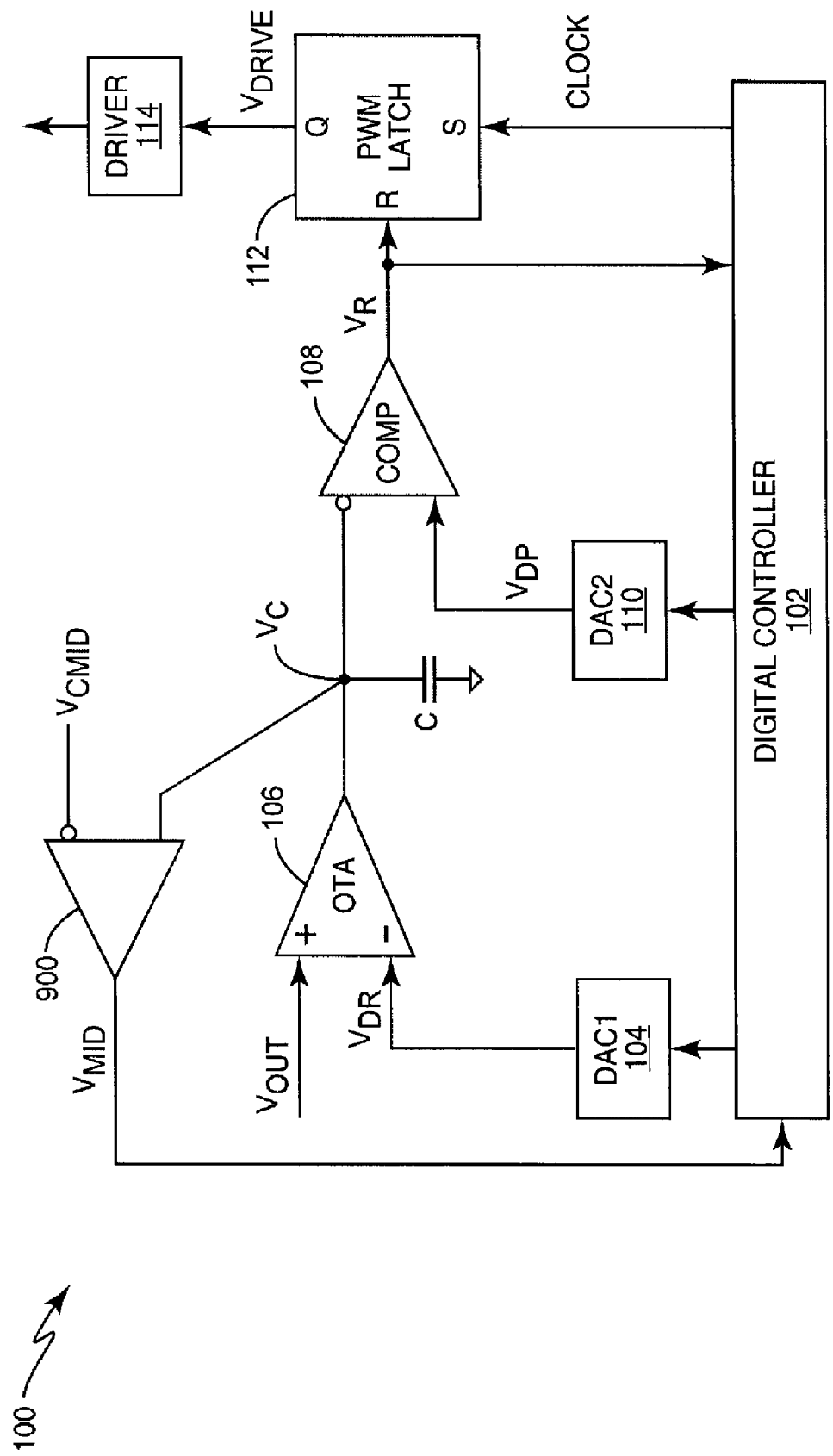
FIG. 9 illustrates a circuit diagram of still another embodiment of a mixed-signal controller.

FIG. 9 illustrates still another embodiment of the mixed-signal controller 100 where the controller 100 includes a midpoint comparator 900. The midpoint comparator 900 determines whether the DC component of the analog modulation signal ($V_C$) is above or below a predetermined reference voltage level ($V_{CMID}$). The output ($V_{MID}$) of the comparator 900 is driven to one state (e.g., positive) when the DC component of $V_C$>$V_{CMID}$ (plus an optional tolerance) and in the opposite state (e.g., negative) when the DC component of $V_C < V_{CMID}$ (plus the optional tolerance). The digital controller 102 process $V_{MID}$ to determine whether to adjust $V_{DR}$ so that the control signal input to DAC1 104 is maintained within the precision of DAC1 104. Otherwise, the control-loop control voltage node $V_C$ may windup or saturate. In one embodiment, the digital controller 102 adjusts the predetermined voltage level responsive to how often the DC component of $V_C$ falls above and/or below $V_{CMID}$.

Figure 10:
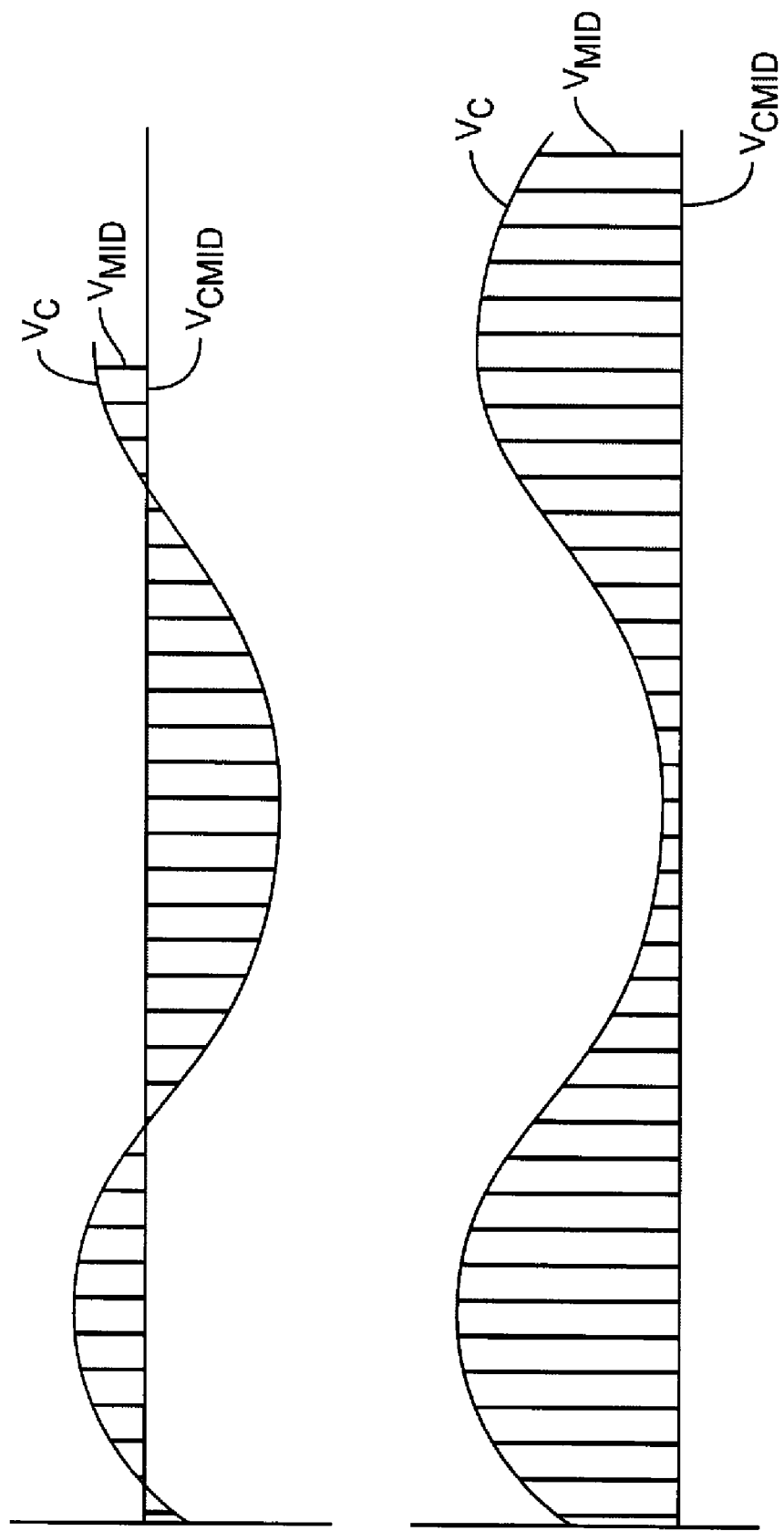
FIG. 10 illustrates waveform diagrams associated with the operation of the mixed-signal controller of FIG. 9.

FIG. 10 illustrates two different waveform examples. The upper waveform shows $V_C$ having about the same time above and below $V_{CMID}$. Under these conditions, $V_{DR}$ is not adjusted because the control-loop control voltage node $V_C$ does not windup or saturate. The digital controller 102 monitors the output ($V_{MID}$) of the midpoint comparator 900 over multiple measurement periods and determines that $V_{DR}$ does not require adjustment. However, $V_C$ is consistently above $V_{CMID}$ during the multiple measurement periods in the lower waveform. Absent an adjustment to $V_{DR}$, the control-loop control voltage node $V_C$ will windup or saturate. In response, the digital controller 102 determines that $V_{DR}$ must be increased so that the OTA 106 and the PWM comparator 108 operate as-if $V_{OUT}$ and $V_{DR}$ are within an acceptable limit even though they are not. By gradually adjusting $V_{DR}$ in this way, the digital controller 102 uses $V_{DR}$ to track $V_{OUT}$ closely and it can then adjust $V_{DP}$ via DAC2 110 to drive $V_{DR}$ toward the desired level of the output voltage. Fine control of the output voltage $V_{OUT}$ is provided by the OTA 106 when $V_{DR}$ equals the target reference and normal small changes in $V_{OUT}$ induce the analog OTA 106 to finely adjust its output in response, thus producing a fine adjustment to the modulated signal $V_R$. The digital controller 102 can also adjust the signal input to DAC2 110 to more coarsely and quickly adjust $V_{OUT}$ as described in more detail later herein.

Figure 11:
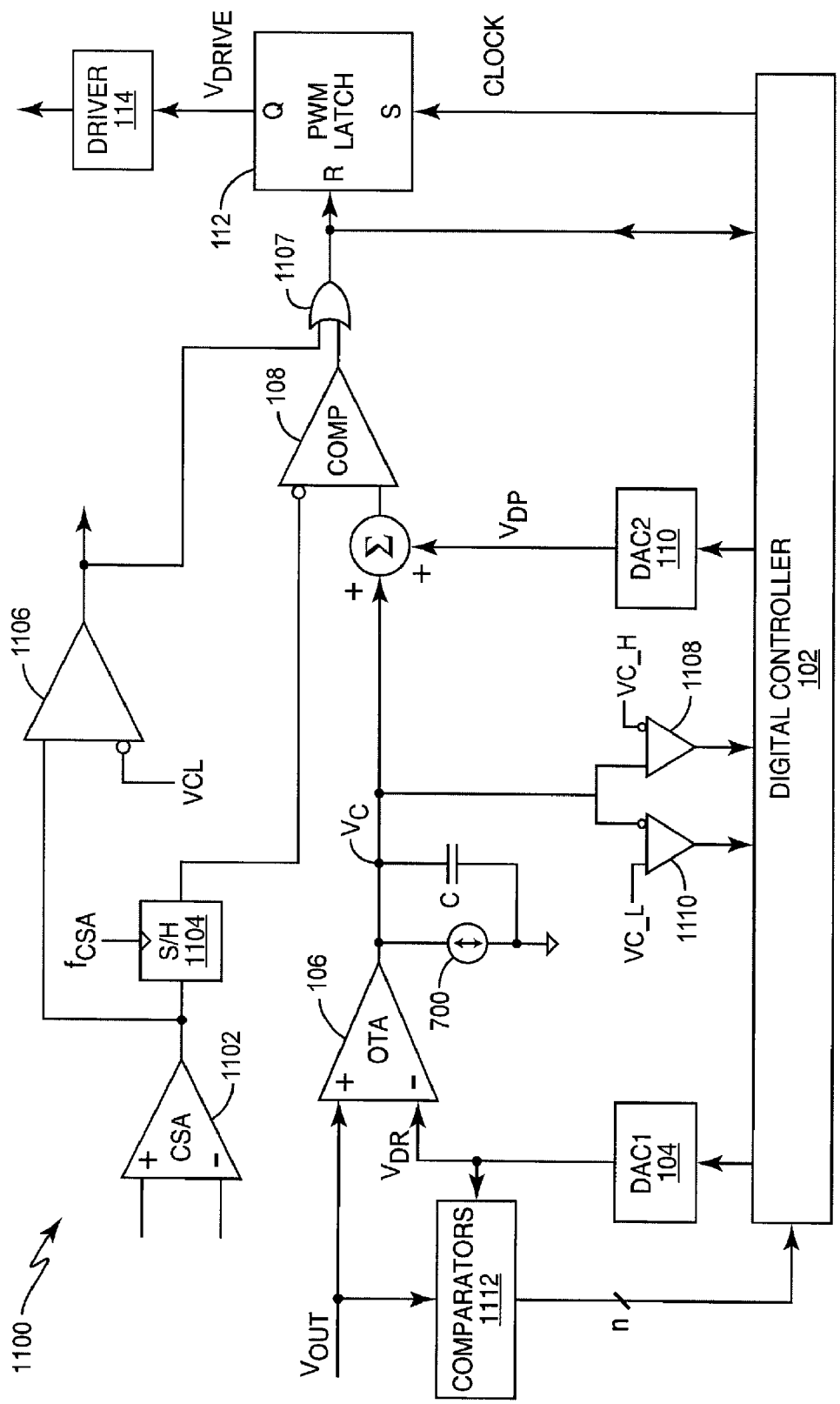
FIG. 11 illustrates a circuit diagram of an embodiment of a mixed-signal controller for use with a multiphase voltage level converter circuit.

In some applications, multiphase voltage level conversion is performed, e.g., using a multiphase buck converter. FIG. 11 illustrates an embodiment of a mixed-signal controller 1100 for use with a multiphase voltage level converter. The multiphase voltage level converter can be formed by coupling a plurality of the synchronous-buck converters shown in FIG. 5 in parallel and driving a common output node (e.g. the $V_{OUT}$ node shown in FIG. 5) where they also share the same load and $C_{VL}$. Each circuit (or phase) of the multiphase voltage level converter is turned on at a timing interval that is equally spaced to the turning on of the other voltage level converter circuits over a switching period. $V_{DP}$ does not need to be synchronized with the switching period. In fact, during a load transient, $V_{DP}$ can be saturated low or high to command 0% or 100% duty-ratio for any number of switching cycles to drive the output back toward regulation. In one embodiment, the mixed-signal controller 1100 operates in a current mode by sampling a current sense signal and using the sampled signal to regulate the output voltage of the multiphase converter. In one embodiment, the mixed-signal controller 1100 includes a current sense amplifier 1102 having inputs from two sides of an inductor included in the multiphase voltage level converter, e.g., the inductor shown in FIG. 5. The current sense amplifier 1102 generates a signal based on the amount of current flowing through the inductor. The signal output by the current sense amplifier 1102 is sampled by a sample and hold circuit 1104 at a sampling frequency ($f_{CSA}$), the output of which is compared to a reference voltage (VCL) by a comparator 1106. The output of the comparator 1106 and the PWM comparator 108 are input to an OR logic gate 1107, the output of which is input to the reset-set latch 112. The sampling of this signal can be done to both avoid switching noise from the voltage level converter 502 and to implement average current mode control. Comparator 1106 can act as a cycle-by-cycle current limit device while the current sense amplifier 1102 and sample and hold circuit 1104 is used for the regulation function of $V_{OUT}$.

The mixed-signal controller 1100 further includes high-side and low-side comparators 1108, 1110. The high-side comparator 1108 indicates to the digital controller 102 when the DC component of the OTA output ($V_C$) exceeds an upper limit ($V_{C\_H}$). The low-side comparator 1110 similarly indicates to the digital controller 102 when the DC component of $V_C$ exceeds a lower limit (VC_L). The digital controller 102 uses this information to determine whether the reference voltage $V_{DR}$ output from DAC1 104 should be adjusted to avoid a windup or saturation condition at the control-loop control voltage node $V_C$.

Figure 12:
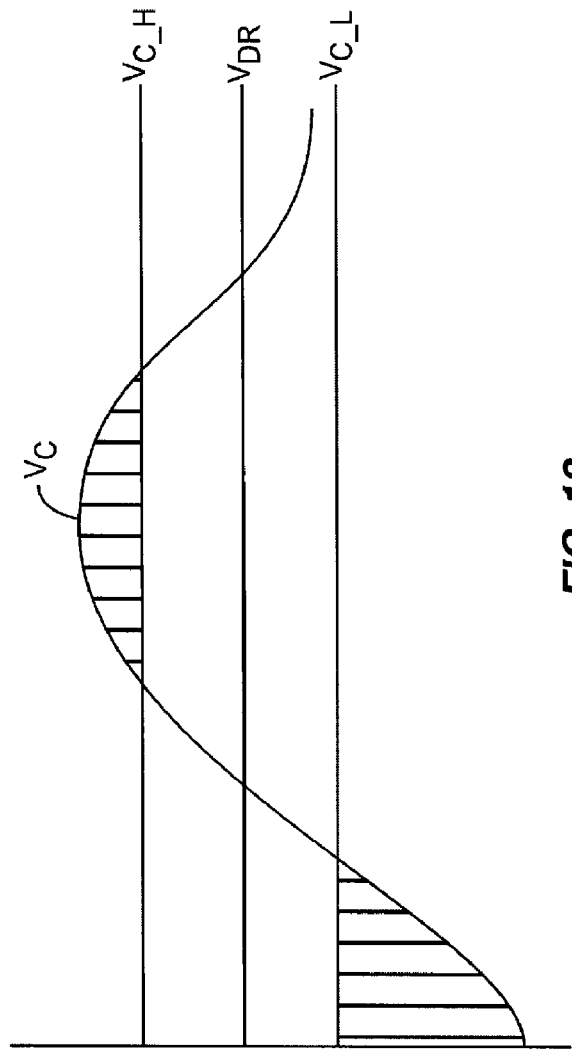
FIG. 12 illustrates a waveform diagram associated with the operation of the mixed-signal controller of FIG. 11.

FIG. 12 illustrates a waveform associated with the operation of the high-side and low-side comparators 1108, 1110. When the DC component of $V_C$ is below the lower threshold ($V_{C\_L}$), the low-side comparator output is activated (e.g., to a logic high or low state). Conversely, the high-side comparator output is activated when the DC component of $V_C$ is above the upper threshold ($V_{C\_H}$). Neither comparator output is active when the DC component of $V_C$ is between the upper and lower thresholds. In response, the digital controller 102 determines whether to adjust $V_{DR}$ based on how often each comparator output is active. If the low-side comparator 1110 is active more often than the high-side comparator 1108, $V_{DR}$ can be lowered and vice-versa.

The mixed-signal controller 1100 can also adjust the level of the input to DAC2 110 so that the control signal is maintained within the precision of DAC2 110. According to one embodiment, a plurality of comparators 1112 determine whether the output voltage ($V_{OUT}$) is above one or more upper threshold levels or below one or more lower threshold levels, e.g., over a number of measurement periods. The digital controller 102 uses this information to adjust the level of the input to DAC2 110 to prevent windup or saturation of the PWM comparator 108. the comparators 1112 operate in a similar fashion as shown in FIG. 12, but with the output voltage $V_{OUT}$ and the digital controller 102 can adjust $V_{DP}$ directly for fast and coarse control of this output voltage.

Figure 13:
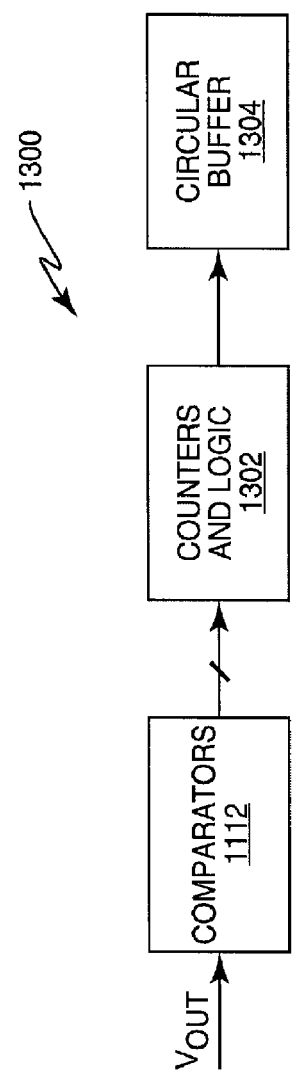
FIG. 13 illustrates a block diagram of an embodiment of voltage tracking logic associated with the mixed-signal controller of FIG. 11.

FIG. 13 illustrates an embodiment of a circuit 1300 for adjusting the level of the input to DAC2 110 so that the control signal is maintained within the precision of DAC2 110. The comparators 1112 perform the threshold analysis described above, but with the target reference of the output voltage $V_{REF}$. $V_{REF}$ often equals or is a fixed portion of the desired output voltage. For example, there may be two upper threshold levels and two lower threshold levels. During a switching period, logic and counter circuitry 1302 counts how many clock pulses occur when the difference between $V_{OUT}$ and $V_{REF}$ exceeds any of the comparator thresholds during the measurement period. For example, there may be 128 system clock pulses during each measurement period. The logic and counter circuitry 1302 counts the number of clock pulses which occur for each of the comparator thresholds. Thus, each threshold level has a clock count value associated with it. Each bin of count values associated with a comparator threshold below $V_{OUT}$ is assigned a negative (or positive) sign and each bin associated with a comparator threshold above $V_{OUT}$ is assigned a positive (or negative) sign. The digital controller 102 combines the different sign values at the end of each measurement period to form a composite value representing whether $V_{OUT}$ tended to be above or below $V_{REF}$ during the measurement period. The composite value is stored in a circular buffer 1304. The digital controller 102 uses the different stored values to adjust the analog PWM reference signal ($V_{DP}$) output by DAC2 110 by modifying the corresponding control signal input to DAC2 110. This way, the digital control signal input to DAC2 110 does not exceed the precision of DAC2 110.

Figure 14:
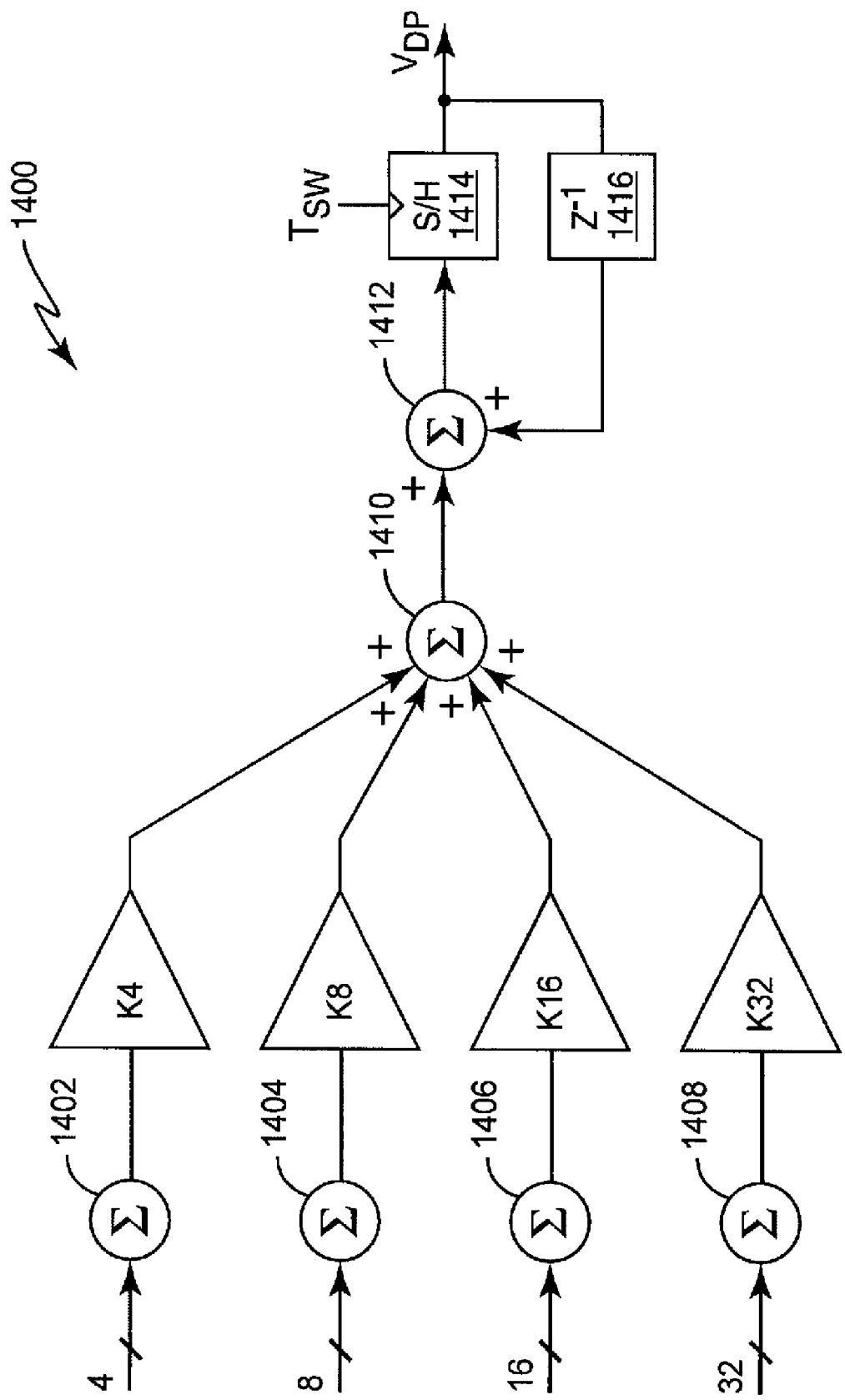
FIG. 14 illustrates a block diagram of an embodiment of voltage analysis logic associated with the mixed-signal controller of FIG. 11.

FIG. 14 illustrates an embodiment of the digital controller logic 1400 used to process the composite count values stored in the circular buffer 1304. The logic 1400 analyzes different groups of past composite values to determine how $V_{DP}$ should be adjusted. For purely illustrative purposes only, the logic 1400 uses the last 4, 8, 16 and 32 composite values stored in the circular buffer 1304. Particularly, a first combiner 1402 combines the last 4 composite count values, a second combiner 1404 combines the last 8 composite count values, a third combiner 1406 combines the last 16 composite count values and a fourth combiner 1408 combines the last 32 composite count values.

Four corresponding gain terms (K4, K8, K16 and K32) are assigned to each of the four different combiner outputs, respectively. The gain stage outputs are combined by a fifth combiner 1410, the output of which is input to a sixth combiner 1412. The output of the sixth combiner 1412 is sampled by a sample-and-hold latch 1414 during a sampling period ($T_{SW}$). The output of the sample-and-hold latch 1414 forms the analog PWM reference signal ($V_{DP}$) input to the PWM comparator 108 which is also fed back to the sixth combiner 1412 through a delay stage 1416. As such the logic 1400 evaluates how well $V_{OUT}$ is being regulated over the last 4, 8, 16 and 32 measurement periods (or any other desirable measurement periods). The count value accumulated over the last 4 measurement periods corresponds to the highest signal frequency, the count value accumulated over the last 32 measurement periods corresponds to the lowest signal frequency and so on. Thus, the digital controller logic 1400 can accumulate and weight the different composite count values based on frequency, e.g., by choosing appropriate gain factors. The different frequency components indicate how well $V_{OUT}$ is being regulated and what modifications, if any, should be made to the control signals programmed by the digital controller 102. Accordingly, the mixed-signal controller 1100 can adjust both $V_{REF}$ and $V_{DP}$ to ensure efficient and reliable system operation.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A mixed signal controller, comprising:
 a fine controller operable to output an analog modulation signal responsive to an analog control signal and a voltage signal input to the fine controller;
 a coarse controller operable to output a digital pulse width modulation (PWM) signal responsive to the analog modulation signal and an analog PWM reference signal input to the coarse controller; and
 a digital controller operable to program the analog control signal and the analog PWM reference signal responsive to the digital PWM signal so that the fine and coarse controllers together regulate the voltage signal at a predetermined voltage level.

2. The mixed signal controller according to claim 1, wherein the fine controller comprises an integrator and the coarse controller comprises a comparator.

3. The mixed signal controller according to claim 2, wherein the integrator comprises a capacitor coupled to the output of an operational transconductance amplifier.

4. The mixed signal controller according to claim 3, further comprising a current source coupled to the output of the operational transconductance amplifier, the current source being operable to induce a sawtooth modulation waveform at the output of the operational transconductance amplifier.

5. The mixed signal controller according to claim 3, further comprising a current sense amplifier coupled to the output of the operational transconductance amplifier, the current sense amplifier being operable to induce a sawtooth modulation waveform at the output of the operational transconductance amplifier.

6. The mixed signal controller according to claim 2, wherein a first digital-to-analog converter (DAC) is operable to convert a first digital control signal output by the digital controller to the analog control signal input to the integrator and a second DAC is operable to convert a second digital control signal output by the digital controller to the analog PWM reference signal input to the comparator.

7. The mixed signal controller according to claim 6, wherein the first digital control signal comprises a first component corresponding to the predetermined voltage level and a second component comprising an asymmetrical ramp signal.

8. The mixed signal controller according to claim 6, wherein the digital controller is operable to adjust the predetermined voltage level so that the first digital control signal does not exceed a precision of the first DAC.

9. The mixed signal controller according to claim 6, wherein the digital controller is operable to adjust the analog PWM reference signal so that the second digital control signal does not exceed a precision of the second DAC.

10. The mixed signal controller according to claim 6, wherein the digital controller is operable to count how many clock pulses occur when the difference between the voltage signal and the predetermined voltage level exceeds any of a plurality of comparator thresholds during a measurement period, combine the count values associated with the different comparator thresholds to form a composite value representing whether the voltage signal tended to be above or below the predetermined voltage level during the measurement period and adjust the analog PWM reference signal responsive to the composite value so that the second digital control signal does not exceed a precision of the second DAC.

11. The mixed signal controller according to claim 10, wherein the digital controller is operable to adjust the analog PWM reference signal based on the composite value computed for each of a plurality of measurement periods.

12. The mixed signal controller according to claim 11, wherein the digital controller is operable to accumulate and weight the different composite values based on frequency.

13. The mixed signal controller according to claim 1, further comprising a comparator operable to determine whether a DC component of the analog modulation signal is above or below the predetermined voltage level and wherein the digital controller is operable to adjust the predetermined voltage level responsive to how often the DC component of the analog modulation signal falls above and/or below the predetermined voltage level.

14. The mixed signal controller according to claim 1, further comprising a latch operable to reset responsive to the digital PWM signal and to set responsive to a clock signal output by the digital controller.

15. A method of operating a mixed signal controller, comprising:
generating an analog modulation signal having a DC component and an AC component responsive to an analog control signal and a voltage signal;
generating a digital pulse width modulation (PWM) signal responsive to the analog modulation signal and an analog PWM reference signal; and
digitally programming the analog control signal and the analog PWM reference signal responsive to the digital PWM signal so that the voltage signal is regulated at a predetermined voltage level.

16. The method according to claim 15, further comprising:
resetting a latch responsive to the digital PWM signal; and
setting the latch responsive to a clock signal.

17. The method according to claim 15, comprising:
generating first and second digital control signals responsive to the digital PWM signal, the first and second digital control signals being programmed so that the voltage signal is regulated at the predetermined voltage level; and
converting the first digital control signal to the analog control signal and the second digital control signal to the analog PWM reference signal.

18. The method according to claim 17, comprising adjusting the predetermined voltage level so that the first digital control signal does not exceed a precision of a digital-to-analog converter operable to convert the first digital control signal to the analog control signal.

19. The method according to claim 17, comprising adjusting the analog PWM reference signal so that the second digital control signal does not exceed a precision of a digital-to-analog converter operable to convert the second digital control signal to the analog PWM reference signal.

20. The method according to claim 19, comprising:
counting how many clock pulses occur when the difference between the voltage signal and the predetermined voltage level exceeds any of a plurality of comparator thresholds during a measurement period;
combining the count values associated with the different comparator thresholds to form a composite value representing whether the voltage signal tended to be above or below the predetermined voltage level during the measurement period; and
adjusting the analog PWM reference signal responsive to the composite value so that the second digital control signal does not exceed the precision of the DAC.

21. The method according to claim 20, comprising adjusting the analog PWM reference signal based on the composite value computed for each of a plurality of measurement periods.

22. The method according to claim 21, comprising accumulating and weighting the different composite values based on frequency.

23. The method according to claim 15, comprising adjusting the predetermined voltage level responsive to how often the DC component of the analog modulation signal falls above and/or below the predetermined voltage level.

24. A mixed signal controller, comprising:
means for generating an analog modulation signal having a DC component and an AC component responsive to an analog control signal and a voltage signal;
a comparator operable to output a digital pulse width modulation (PWM) signal responsive to the analog modulation signal and an analog PWM reference signal input to the comparator; and
a digital controller operable to program the analog control signal and the analog PWM reference signal responsive to the digital PWM signal so that the voltage signal is regulated at a predetermined voltage level.

25. A voltage converter circuit, comprising:
a voltage level converter operable to output a voltage; and
a mixed signal controller operable to generate an analog modulation signal responsive to an analog control signal and the voltage output by the voltage level converter, generate a digital pulse width modulation (PWM) signal responsive to the analog modulation signal and an analog PWM reference signal and digitally program the analog control signal and the analog PWM reference signal responsive to the digital PWM signal so that the voltage output by the voltage level converter is regulated at a predetermined level.

26. The voltage converter circuit according to claim 25, wherein the voltage level converter comprises a synchronous buck converter.

27. The voltage converter circuit according to claim 25, wherein the voltage level converter comprises a multiphase voltage level converter.

28. The voltage converter circuit according to claim 27, further comprising a current sense amplifier coupled to an inductor of the multiphase voltage level converter, a sample and hold circuit having an input coupled to an output of the current sense amplifier and an output coupled to an input of a comparator component of the mixed signal controller and a gate driver having an input coupled to an output of the comparator and an output coupled to a gate of one or more transistor components of the multiphase voltage level converter.

29. The voltage converter circuit according to claim 28, wherein the sample and hold circuit is operable to periodically sample the output of the current sense amplifier and input the sampled output to the comparator.

* * * * *